(12) United States Patent
Totani

(10) Patent No.: US 11,349,333 B1
(45) Date of Patent: May 31, 2022

(54) MONITORING OF REDUNDANT UPS CONTROL SYSTEMS

(71) Applicant: Amazon Technologies, Inc., Seattle, WA (US)

(72) Inventor: Mozan Totani, Tokyo (JP)

(73) Assignee: Amazon Technologies, Inc., Seattle, WA (US)

( * ) Notice: Subject to any disclaimer, the term of this patent is extended or adjusted under 35 U.S.C. 154(b) by 0 days.

(21) Appl. No.: 17/119,799

(22) Filed: Dec. 11, 2020

(51) Int. Cl.
*H02J 9/06* (2006.01)
*G06F 1/30* (2006.01)
*G01R 31/40* (2020.01)

(52) U.S. Cl.
CPC ............. *H02J 9/06* (2013.01); *G01R 31/40* (2013.01); *G06F 1/30* (2013.01); *H02J 9/061* (2013.01)

(58) Field of Classification Search
CPC .............. H02J 9/061; H02J 9/062; G06F 1/30
See application file for complete search history.

(56) References Cited

U.S. PATENT DOCUMENTS

| | | | | |
|---|---|---|---|---|
| 5,982,652 A * | 11/1999 | Simonelli | ............... | H02M 1/10 363/142 |
| 9,800,087 B2 * | 10/2017 | Kouroussis | ........... | H02J 7/0063 |
| 10,635,627 B2 * | 4/2020 | Patel | ................... | G06F 13/4295 |
| 2001/0033502 A1 * | 10/2001 | Blair | ..................... | H02J 7/0013 363/65 |

* cited by examiner

*Primary Examiner* — Ryan Johnson
(74) *Attorney, Agent, or Firm* — Kilpatrick Townsend & Stockton LLP

(57) ABSTRACT

A system and method for operation of an uninterruptible power supply using redundant control systems to prevent UPS failure due to a control system failure are described. The system includes multiple control modules for each UPS of a data center operating in parallel, with a primary control board controlling operations and a secondary control board monitoring data values monitored as part of the operation by the primary control board. In the event of discrepancies between the data values at the primary and secondary control boards, the control boards may be swapped such that the secondary board becomes primary, and the faulty control board may be hot-swapped to prevent downtime of the UPS.

20 Claims, 6 Drawing Sheets

MONITORING OF REDUNDANT UPS CONTROL SYSTEMS

BACKGROUND

Organizations such as on-line retailers, Internet service providers, search providers, financial institutions, universities, and other computing-intensive organizations often conduct computer operations from large scale computing facilities such as data centers. Such computing facilities house and accommodate a large amount of server, network, computer, and other electrical equipment to process, store, and exchange data as needed to carry out an organization's operations. Typically, a computer room of a data center includes many electronic component racks. Each rack, in turn, includes many electronic components and associated equipment.

Some data centers include back-up components and systems to provide back-up power to electronic components in the event of a failure of components or systems in a primary power system. The back-up power may be provided by an uninterruptible power supply (UPS) to provide seamless transition and continuous power to the electronic components without interruption. In some data centers, each primary power system may have its own back-up system that is fully redundant at all levels of the power system. For example, in a data center having multiple rooms, each room may have its own primary power system and back-up power system.

BRIEF DESCRIPTION OF THE DRAWINGS

Various embodiments in accordance with the present disclosure will be described with reference to the drawings, in which.

DETAILED DESCRIPTION

Figure 1:
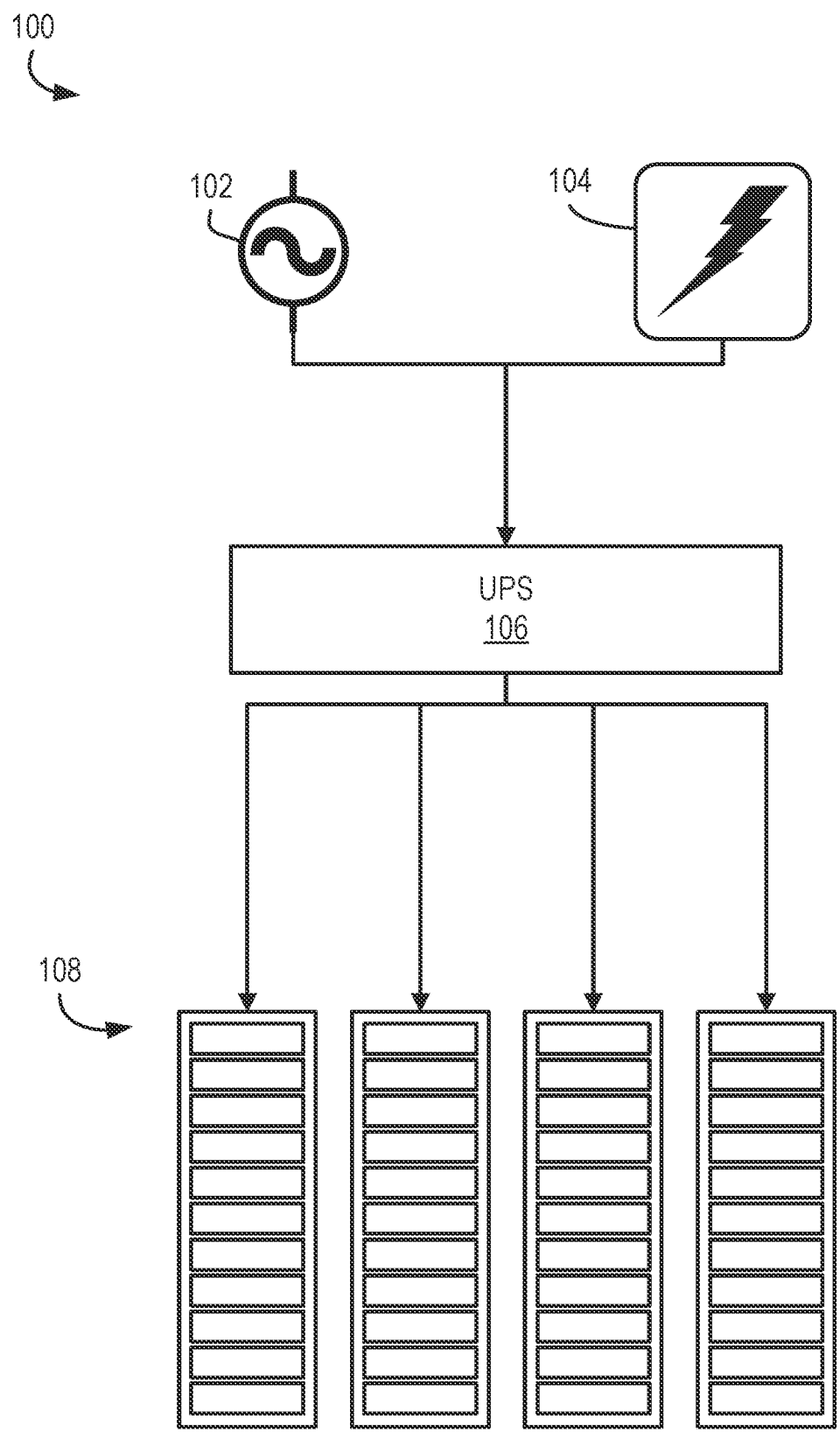
FIG. 1 illustrates an example system with a plurality of data center component racks powered by a UPS including redundant control modules to prevent control system failure of the UPS, according to at least some embodiments.

Embodiments and techniques described herein are directed to redundant control systems for uninterruptible power supplies (UPSs) and methods associated with the same for monitoring and preventing failure of the UPS due to control system failure. Data centers include sets of rack computer systems and other such electronic data center components and a power distribution system that provides electrical power to the electronic data center components. The power distribution system includes a power supply, such as a utility power line, and UPSs. The UPS receives electrical power from the power supply and provides uninterruptible power support to the electronic data center components. In some cases the UPS is also coupled to an alternative energy source such as a battery or a generator system, through a rectifier to supply electrical power to the electronic data center components in the event the utility line fails to supply power, for example due to a power outage. The UPS may include a control module that controls operation of the UPS including operations to determine whether to switch from a primary to an alternative power source. The control module also monitors health and operation of the UPS and may provide advanced warning of failures of components, for example due to inconsistent temperature or electrical readings. According to at least some embodiments described herein, the UPS includes redundant UPS control modules, a first control module operating as a primary control module that monitors and controls operation of the UPS. A second control module operates as a monitor, and provides a second data set for comparison against data from the first control module. The parallel control modules may enable identification of a failure of one of the control modules prior to failure of the UPS and may, in some examples, change operation of the secondary control module to handle operation of the UPS in the event of failure of the primary control module.

In typical systems, although the UPS is designed to maintain a stable power supply, a majority of power incidents are caused by electrical equipment failure, including failures of components of the UPS. The most common UPS failures are cause by battery failures and control board failures. A control board failure may result in catastrophic failure such as a total UPS system shutdown. When a control board fails, it usually requires the UPS to be forced to shut down, and to replace the entire control system. The control system is often a proprietary system that must be replaced by the UPS supplier. In an example of a data center UPS it may take four or more hours to repair a control system failure, and such prolonged downtime exposes the data center to long availability risk.

As used herein, a data center includes any facility or portion of a facility in which computer operations are carried out. A data center may include electronic data center components, such as servers, dedicated to specific functions or serving multiple functions. Examples of computer operations include information processing, communications, simulations, and operational control.

In an illustrative example, a data center includes a plurality of racks of electronic data center components. The components are each powered by a power source including one or more UPSs. Each UPS is composed of battery, rectifier, inverter, switch and a few filters. The UPS monitors power instability and switches to battery mode to continue to supply power to the equipment connected downstream. The UPSs according to the present description each include two, or more, control modules that monitor specific parameters of the UPS. Each control module, though distinct from one another, monitors at least some of the same monitor points on the UPS. Therefore, discrepancies between data at a first and a second control module may be indicative of a failure of one of the control modules rather than a failure of a component of the power supply.

In the illustrative example, the second control module may be switched to take over control of devices under the control of the first control module, for example to control switching of power sources of the UPS or other such operations. A failure of the first, or the second, control module may be determined by an operator of the data center, such as a building computing system that monitors activity within the data center. A monitoring system, which may be included with the building computing system or in communication with the same, monitors and compares values from both control modules. In the event of a discrepancy or an abnormality, the monitoring system commands the second control module, previously acting in a monitor only capacity, to take over control of the devices. Based on discrepancies in values between control modules, the monitoring system or an operator of the data center may identify which of the control modules is in failure and instruct replacement of the same. In the event of a persistent failure detected after replacement, then the non-replaced control module may be identified as the source of the failure and replaced.

The monitoring system may, in some examples, collect data from other UPSs in the same system, such as other UPSs of the data center or of a server room of the data center. The monitoring system may compare data values from across multiple UPSs to identify outliers and potentially faulty equipment before a failure occurs that impacts operation of the data center.

The control modules described herein are designed to be hot-swappable, which means that replacement of a control module does not require the UPS to be shut down, potentially putting operation of the data center at risk should a failure occur during replacement.

In the following description, various embodiments will be described. For purposes of explanation, specific configurations and details are set forth in order to provide a thorough understanding of the embodiments. However, it will also be apparent to one skilled in the art that the embodiments may be practiced without the specific details. Furthermore, well-known features may be omitted or simplified in order not to obscure the embodiment being described.

FIG. 1 illustrates an example system 100 with a plurality of data center component racks 108 powered by a UPS 106 including redundant control modules to prevent control system failure of the UPS 106, according to at least some embodiments. The UPS 106 provides power to the data center component racks 108 from a utility line 102 and/or from a reserve power system 104. The reserve power system may be a battery backup, a generator, a backup utility line, or other such alternative energy source to a primary utility line 102 providing power to the data center. The UPS 106 ensures that the power supplied to the data center component racks 108 is uninterruptible and thereby ensures continuous operation of the data center. In further embodiments, the UPS 106 is used in power configurations other than those shown in FIG. 1. For example, the UPS 106 may be connected to the utility line 102, but not to a reserve power system 104. The utility line 102 and the reserve power system may be part of a power supply system that provides power to the data center component racks 108.

The UPS 106 includes redundant control systems for controlling and monitoring operation of the UPS 106 in real-time. Though only a single UPS 106 is pictured in FIG. 1, the system 100 may include multiple UPSs 106 to provide power to a plurality of devices, the particular components of the UPS are shown and described in further detail with respect to FIGS. 2 and 3. The UPS 106 includes a primary and a secondary control system, each connected to at least some elements of UPS 106. However, in operation only the primary is active and controlling operation of the UPS 106 while the secondary control system provides monitoring only. By keeping both the primary and the secondary control systems online, each can monitor all UPS values at the same time. The UPS control systems not only monitors incoming power but also monitors other values such as battery, inverter, rectifier and even magnetizing current coming back from downstream transformer and other such values related to the operation of the UPS 106.

When a difference exists between values at the primary and secondary control systems, a monitoring system that is connected to each of the control systems generates an alarm. In typical systems, a control system may only generate an alarm if a particular value deviates from a predetermined threshold. In the embodiments described herein, the monitoring system may generate the alarm if the values for the same data, such as a magnetizing current value, differ between the two control systems. In some embodiments, the alarm may only be generated if the difference between the two values exceeds a predetermined threshold. In this way, the redundant control system and monitoring system of system 100 enable detection of failures within the control system or other components without detecting a deviation from a predetermined threshold for a particular value. For instance, a magnetizing current as detected by the primary and the secondary control system may each be within an acceptable or designed threshold to prevent generating an alarm. However, a difference may exist between the two values such that would only be possible given a failure of a component of the system 100. As such, the components may be identified and replaced before reaching a failure point as previously detectable through typical systems.

Figure 2:
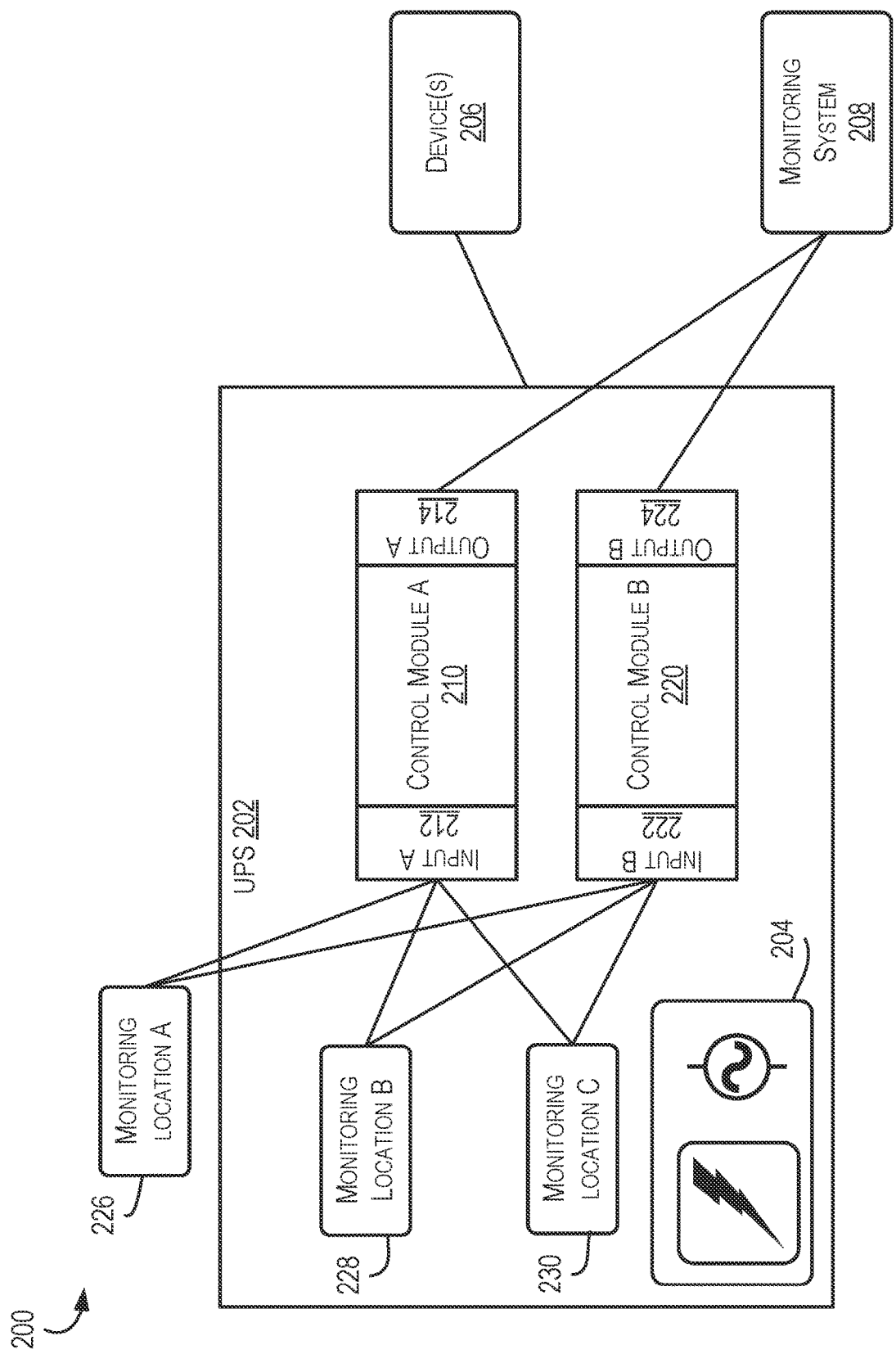
FIG. 2 illustrates a block diagram showing elements of a UPS system with redundant control modules for providing power to a data center and preventing control system failure of the UPS, according to at least some embodiments.

FIG. 2 illustrates a block diagram showing elements of a UPS system 200 with redundant control modules for providing power to a data center and preventing control system failure of the UPS system 200, according to at least some embodiments. The UPS 202 may be an example of the UPS 106 of FIG. 1. The UPS 202 is shown as a simplified block diagram illustrating components relevant to the present embodiments. The UPS 202 includes connections 204 to power supplies such as the utility line 102 and the reserve power system 104. The UPS 202 also includes control module A 210 and control module B 220. Control module A 210 and control module B 220 may each be included in a control assembly for the UPS 202. Each of the control modules 210 and 220 are fully functional to individually control operation of the UPS 202. The control modules 210 and 220 are also connected to monitoring locations A-C 226, 228, and 230, monitoring locations A-C 226, 228, and 230 may be within and/or outside of the UPS 202. Control module A 210 at input A 212 receives inputs from the monitoring locations A-C 226, 228, and 230. Control module B 220 at input B 222 receives inputs from the monitoring locations A-C 226, 228, and 230. The UPS system 200 also includes device(s) 206 that are powered by the UPS system 200 such as a server system or electronic data center component. The UPS system 200 also includes a monitoring system 208 connected to outputs A and B 218 and 224 of control modules A and B 210 and 220. The monitoring system compares data values from each of the control modules 210 and 220, which receive monitoring data from the same monitoring locations 226, 228, and 230 and determines when the data values differ between the control modules.

In operation, the UPS 202 provides an uninterrupted power supply to device(s) 206 as controlled by control module A 210. Control module A 210 determines which power supply to use to provide power based on monitoring data from the monitoring locations A-C 226, 228, And 230. When the monitoring system 208 determines that a value at the control module A 210 differs from a value representing identical data at control module B 220, the monitoring system 208 generates an alarm. The UPS system 200 UPS enables how-swapping of control modules without shutting down the UPS 202 and potentially putting the device(s) 206 at risk, because the UPS 202 will always maintain at least one control system in operation due to the redundant control. When the monitoring system generates an alarm, due to the difference in values, the operation of the UPS 202 switches from the control module A 210 to the control module B 220. The control module A 210 may then be replaced with a spare control module and returned to service. If, after replacement of the control module A 210, the alarm is still present, the same process will be carried out on control module B 220 to isolate and replace the secondary control system. In this manner, potential catastrophic control system failure can be detected early and be resolved.

Figure 3:
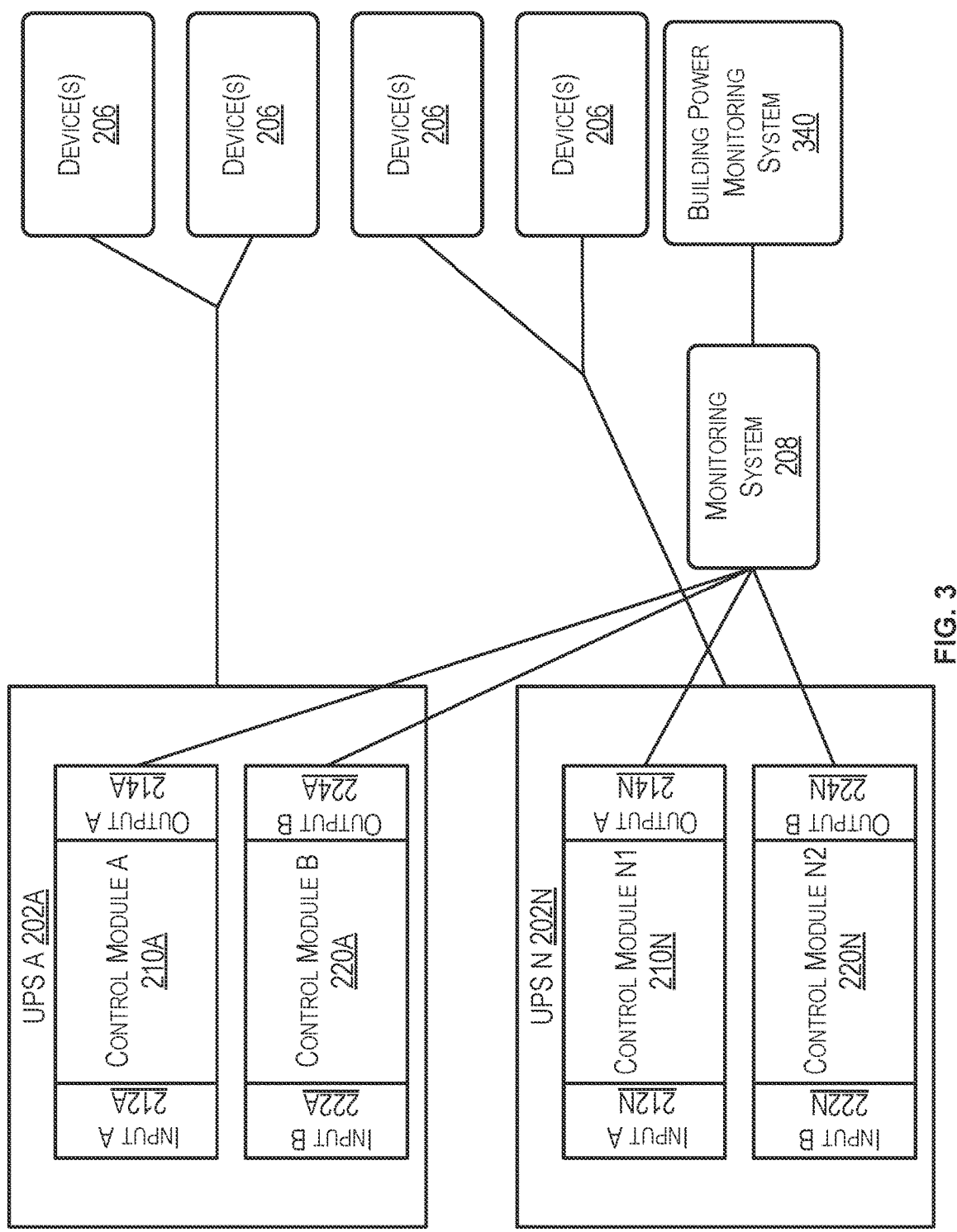
FIG. 3 illustrates a block diagram showing elements of a monitoring system for monitoring redundant control systems of multiple UPS systems in a data center, according to at least some embodiments.

FIG. 3 illustrates a block diagram showing elements of a system 300 for monitoring redundant control systems of multiple UPS systems 202 in a data center, according to at least some embodiments. In addition to monitoring control modules 210 and 220 of a single UPS 202, the systems described herein enable monitoring of data values between different control modules of different UPS systems. For example, as shown in FIG. 3, UPS A 202A and UPS N 202N each include two control modules connected and monitoring data values of the respective UPSs as described above with respect to FIG. 2. Typically, data centers house multiple UPSs connected to the same power source. If there is a power event, such as an outage, then each of the UPSs 202 will behave the same manner, likewise, fluctuations in magnetizing currents, voltages, inverter current and voltage, and other such data values related to the operation of the UPSs 202 will behave and appear similar if not identical.

As a result of the parallel use of multiple UPSs 202, the health of different UPSs 202 may be confirmed by comparing monitoring values from other UPSs 202 within the data center, for example that share the same power supply. In an example, multiple control modules may be manufactured together or simultaneously as part of a batch and may have a quality issue or common defect. The monitoring system 208, may compare monitoring values from different UPSs 202 to identify potentially problematic batches of control modules, such as a set of control modules that present monitoring values that diverge from the remainder of the control modules.

In some examples, the monitoring system 208, may identify which of the control module A 210 or control module B 220 are faulty or failing by comparison of monitoring values against monitoring values from UPS N 202N. In an example where a secondary or monitoring-only control module is in failure, a typical procedure may cause an alarm to be generated that results in replacement of the primary control module, and only upon replacement of the primary to deduce that the secondary control module is failing and causing a discrepancy with the monitoring values. By using the monitoring system 208 to compare control modules across UPSs 202, the failure of the secondary control module is readily apparent as the monitoring values of the secondary control module will deviate not only from the primary control module but also from the control module of an additional UPS 202.

The monitoring system 208 may communicate with a building power monitoring system 340, such as part of an overall data center monitoring station or system. The building power monitoring system may provide displays where alerts and signals relating to failures of control modules may be displayed for action.

Figure 4:
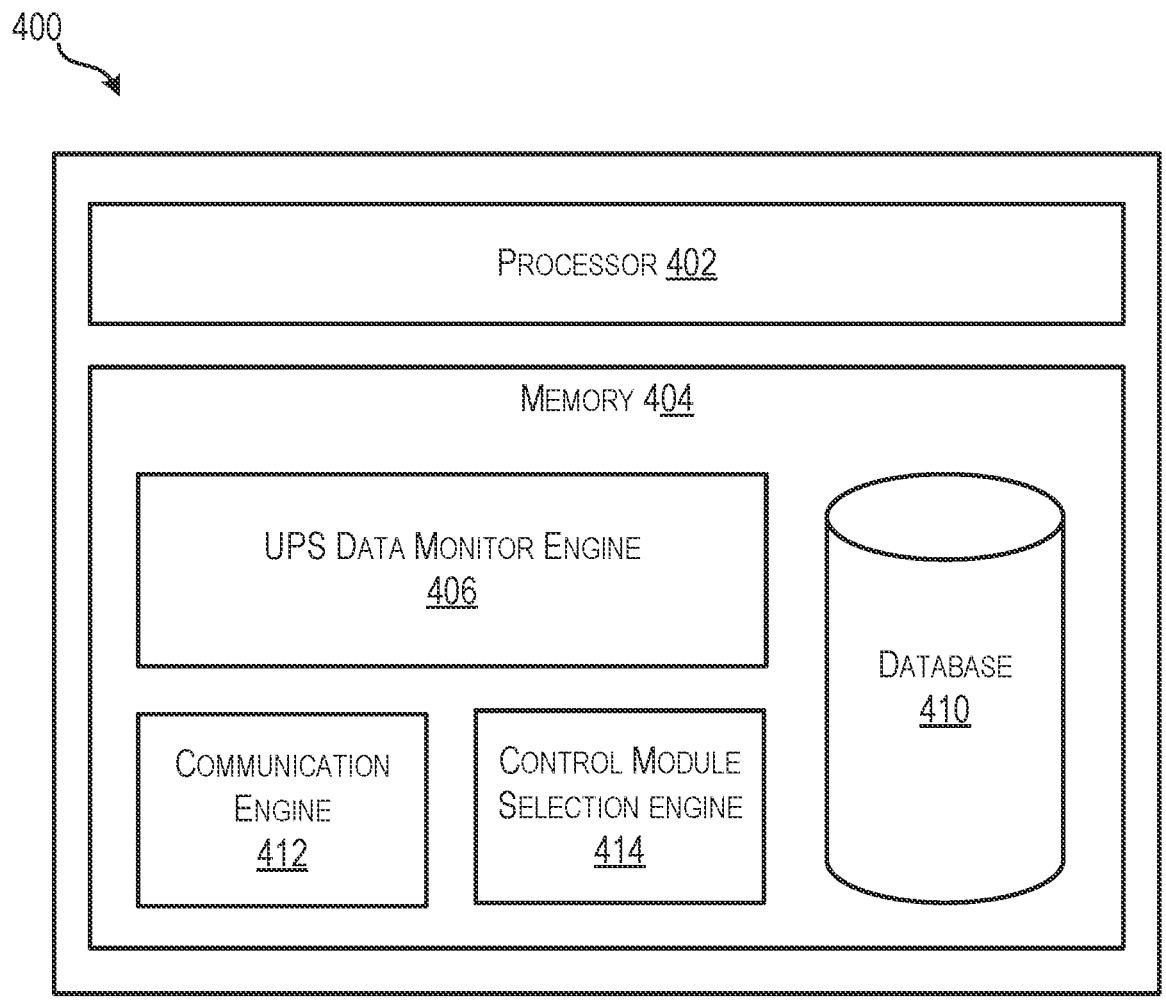
FIG. 4 illustrates a block diagram showing elements of the monitoring system of FIG. 3, according to at least some embodiments.

FIG. 4 illustrates a block diagram showing elements of a monitoring system 400, such as the monitoring system 208 of FIG. 3, according to at least some embodiments. In some examples, the monitoring system 400 may be carried out on a computing device, such as computing device 600 of FIG. 6. Additionally, elements included within the monitoring device 400 may, in some examples be implemented as separate elements, such as individual software elements or may be implemented in a combined manner, for example with a single software package enabling the actions of one or more elements of the monitoring system 400.

The monitoring system 400 includes a processor 402 and a memory 404. The processor 402 may be a single processor or a number of processors, such as arranged in a computing system such as a server system and/or a cloud computing system. The memory 404 may be a non-transitory memory including instructions for carrying out different methods and steps described herein, such as process 500 of FIG. 5. The processor 402 may execute the instructions from the memory 404 that cause the processor 402 to perform various actions of the methods and steps.

In particular, the memory 404 may include a UPS data monitor engine 406, an electrical monitor engine 406, a database 410, a communication engine 412, and a control module selection engine 414. The some embodiments, the memory 404 may include multiple different memory devices or partitions. In some embodiments the modules and engines described with respect to memory 404 may not be stored as independent modules or engines, but may be stored in any suitable configuration. In some embodiments, some or all of the operations performed by the monitoring system may be performed at one or more of the building power monitoring system and/or one or more control modules of the UPSs.

The UPS data monitor engine 406 may compare monitoring values received by the communication engine 412 and identify any discrepancies in the monitoring values that may be indicative of control module failure. The UPS data monitor engine 406 may compare monitoring values for different data evaluated by the control modules including currents, voltages, frequencies, magnetizing currents, power input and output, temperatures, fuse statuses, battery statuses, battery test results, ground faults, or any other data related to operation of the UPS or a system connected thereto. The UPS data monitor engine 406 may, in some embodiments identify absolute differences between values of control modules connected to identical monitoring locations. The UPS data monitor engine 406 may, in some embodiments, identify when monitoring values from control modules of a single UPS differ from one another by more than a predetermined threshold. The predetermined threshold may be a percentage, such as a difference of greater than five percent or may be an absolute value, such as a difference in voltage of greater than 0.5 volts. The UPS data monitor engine 406 may also compare monitoring values between separate UPSs and may perform a similar comparison to that described above between monitoring values from different control modules of different UPSs to identify any particular discrepancies or differences.

The database 410 may store information such as predetermined threshold information that may be used by the UPS data monitor engine 406 to identify when a control module is providing monitor values inconsistent or outside the predetermined threshold, of a control module connected to the same monitoring points. The database 410 may also store information related to a particular fault location, a history of faults, a complete log of monitoring values, and other such data.

The communication engine 412 may output data, such as an alarm or alert to a display, such as a display of the building power monitoring system 340 of FIG. 3. The communication engine 412 may also receive input data from each of the control modules of various UPS systems connected to the monitoring system 400. The communication engine 400 may enable communication between different computing systems over various network and direct communication means including wired and wireless communication means.

The control module selection engine 414 provides controls for selection of a primary and a secondary control module of each UPS. The primary control module may initially be set and, upon determination of a failure of the primary control module, as described above, the monitoring system 400 may cause the secondary control module to assume the role of the primary control module so the failed control module may be replaced without removing the UPS from service.

Figure 5:
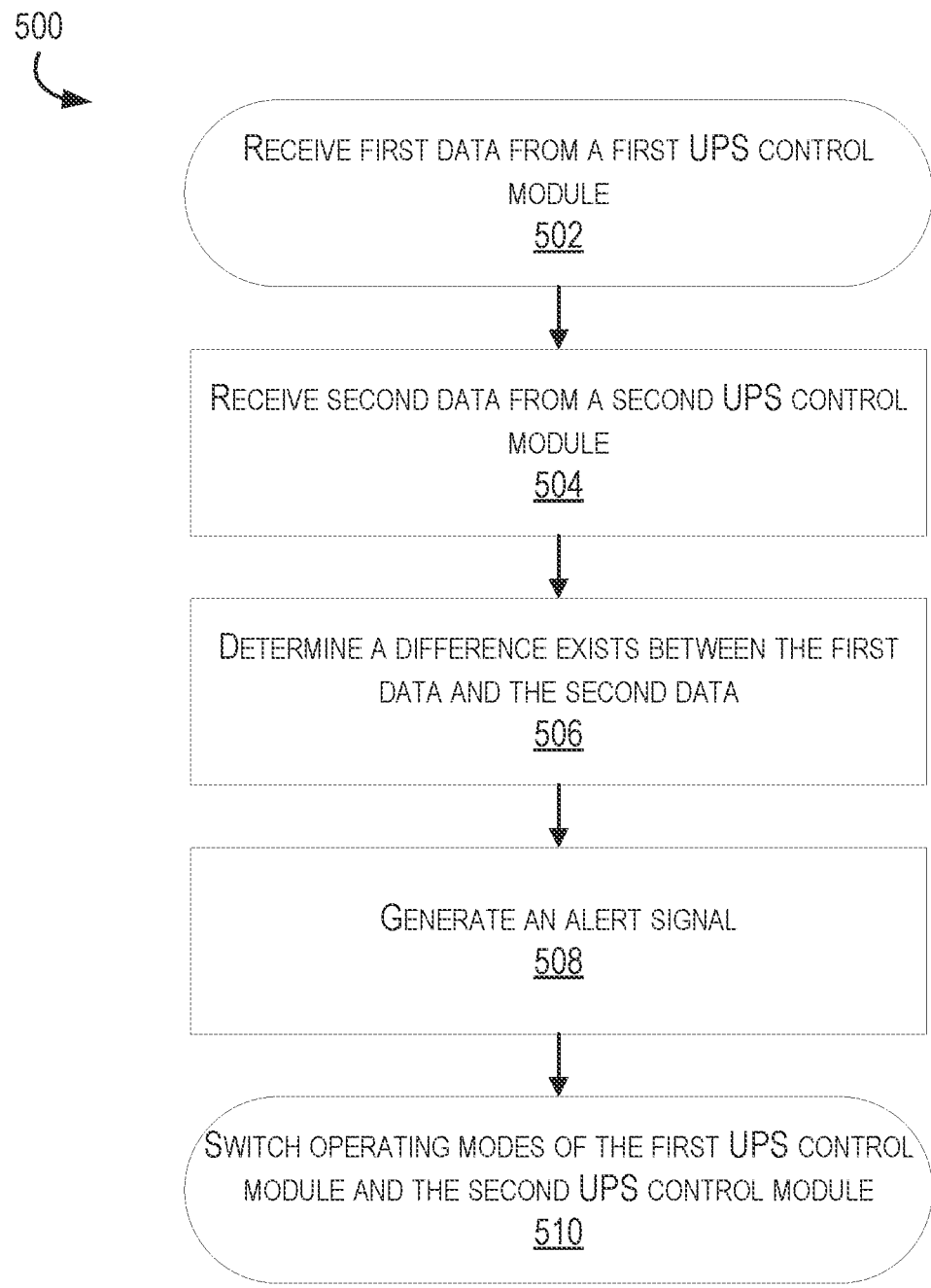
FIG. 5 illustrates an example process for monitoring redundant control systems of UPSs for a data center to prevent failure of the UPS, according to at least some embodiments.

FIG. 5 illustrates an example process for monitoring redundant control systems of UPSs for a data center to prevent failure of the UPS, according to eat least some embodiments.

Some or all of the process 500 (or any other processes described herein, or variations, and/or combinations thereof) may be performed under the control of one or more computer systems configured with executable instructions and may be implemented as code (e.g., executable instructions, one or more computer programs, or one or more applications) executing collectively on one or more processors, by hardware or combinations thereof. The code may be stored on a computer-readable storage medium, for example, in the form of a computer program comprising a plurality of instructions executable by one or more processors. The computer-readable storage medium may be non-transitory. The process 500 may be implemented, for example, at the monitoring system 208 and 400.

At 502, the process 500 includes receiving first data from a first UPS control module. The first data includes monitoring data of the UPS system related to the operation of the UPS, the utility power, the alternative power supply, and any combination thereof. The first UPS control module gathers such data from monitoring locations within the UPS system.

At 504, the process 500 includes receiving second data from a second UPS control module. The second data includes monitoring data of the UPS system related to the operation of the UPS, the utility power, the alternative power supply, and any combination thereof. The second UPS control module gathers such data from the same monitoring locations within the UPS system as the monitoring locations where the first data is gathered.

At 506, the process 500 includes determining that a difference exists between the first data and the second data. The determination of a difference may be based on a difference exceeding a predetermined threshold, for example when a difference exceeds a certain percentage of the value measured by each control module, such as when the difference is greater than five percent of the value. In some examples the threshold may be when the difference is greater than one percent or any other suitable threshold, either relative (such as a percentage) or absolute (such as a voltage difference measured by the control modules).

At 508, the process 500 includes generating an alert signal. The alert signal is generated in response to determining a difference exists between the first data and the second data. The alert signal may indicate the discrepancy and may indicate the identity of the control module having the failure. The alert signal may be communicated to a building power monitoring system for display and further action, including replacement of the failed component.

At 510, the process 500 includes switching operating modes of the first UPS control module and the second UPS control module. With one of the control modules acting as primary and the other as monitoring only, upon determining a failure of the primary control module, the operating conditions of each may be switched such that the monitoring only control module becomes the primary module that controls operation of the UPS.

Figure 6:
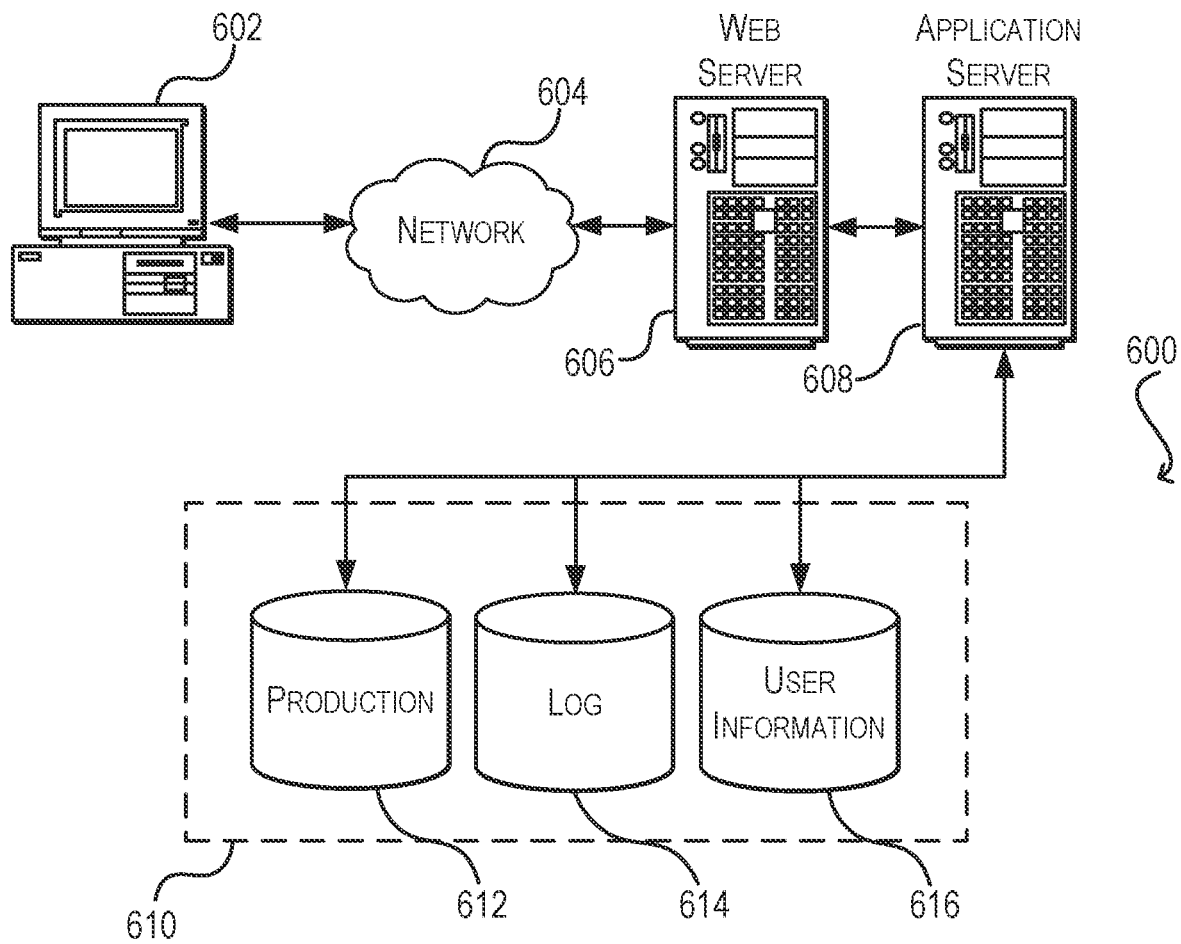
FIG. 6 illustrates an environment in which various embodiments can be implemented.

FIG. 6 illustrates aspects of an example environment 600 for implementing aspects in accordance with various embodiments. As will be appreciated, although a Web-based environment is used for purposes of explanation, different environments may be used, as appropriate, to implement various embodiments. The environment includes an electronic client device 602, which can include any appropriate device operable to send and receive requests, messages, or information over an appropriate network 604 and convey information back to a user of the device. Examples of such client devices include personal computers, cell phones, handheld messaging devices, laptop computers, set-top boxes, personal data assistants, electronic book readers, and the like. The network can include any appropriate network, including an intranet, the Internet, a cellular network, a local area network, or any other such network or combination thereof. Components used for such a system can depend at least in part upon the type of network and/or environment selected. Protocols and components for communicating via such a network are well known and will not be discussed herein in detail. Communication over the network can be enabled by wired or wireless connections and combinations thereof. In this example, the network includes the Internet, as the environment includes a Web server 606 for receiving requests and serving content in response thereto, although for other networks an alternative device serving a similar purpose could be used as would be apparent to one of ordinary skill in the art.

The illustrative environment includes at least one application server 608 and a data store 610. It should be understood that there can be several application servers, layers, or other elements, processes, or components, which may be chained or otherwise configured, which can interact to perform tasks such as obtaining data from an appropriate data store. As used herein the term "data store" refers to any device or combination of devices capable of storing, accessing, and retrieving data, which may include any combination and number of data servers, databases, data storage devices, and data storage media, in any standard, distributed, or clustered environment. The application server can include any appropriate hardware and software for integrating with the data store as needed to execute aspects of one or more applications for the client device, handling a majority of the data access and business logic for an application.

The data store 610 can include several separate data tables, databases or other data storage mechanisms and media for storing data relating to a particular aspect. For example, the data store illustrated includes mechanisms for storing production data 612 and user information 616, which can be used to serve content for the production side. The data store also is shown to include a mechanism for storing log data 614, which can be used for reporting, analysis, or other such purposes. It should be understood that there can be many other aspects that may need to be stored in the data store, such as for page image information and to access right information, which can be stored in any of the above listed mechanisms as appropriate or in additional mechanisms in the data store 610. The data store 610 is operable, through logic associated therewith, to receive instructions from the application server 608 and obtain, update or otherwise process data in response thereto. In one example, a user might submit a search request for a certain type of item. In this case, the data store might access the user information to verify the identity of the user and can access the catalog detail information to obtain information about items of that type. The information then can be returned to the user, such as in a results listing on a Web page that the user is able to view via a browser on the user device 602. Information for a particular item of interest can be viewed in a dedicated page or window of the browser.

Each server typically will include an operating system that provides executable program instructions for the general administration and operation of that server and typically will include a computer-readable storage medium (e.g., a hard disk, random access memory, read only memory, etc.) storing instructions that, when executed by a processor of the server, allow the server to perform its intended functions. Suitable implementations for the operating system and general functionality of the servers are known or commercially available and are readily implemented by persons having ordinary skill in the art, particularly in light of the disclosure herein.

The environment in one embodiment is a distributed computing environment utilizing several computer systems and components that are interconnected via communication links, using one or more computer networks or direct connections. However, it will be appreciated by those of ordinary skill in the art that such a system could operate equally well in a system having fewer or a greater number of components than are illustrated in FIG. 6. Thus, the depiction of the system 600 in FIG. 6 should be taken as being illustrative in nature and not limiting to the scope of the disclosure.

The various embodiments further can be implemented in a wide variety of operating environments, which in some cases can include one or more user computers, computing devices or processing devices which can be used to operate any of a number of applications. User or client devices can include any of a number of general purpose personal computers, such as desktop or laptop computers running a standard operating system, as well as cellular, wireless, and handheld devices running mobile software and capable of supporting a number of networking and messaging protocols. Such a system also can include a number of workstations running any of a variety of commercially-available operating systems and other known applications for purposes such as development and database management. These devices also can include other electronic devices, such as dummy terminals, thin-clients, gaming systems, and other devices capable of communicating via a network.

Such devices also can include a computer-readable storage media reader, a communications device (e.g., a modem, a network card (wireless or wired)), an infrared communication device, etc.), and working memory as described above. The computer-readable storage media reader can be connected with, or configured to receive, a computer-readable storage medium, representing remote, local, fixed, and/or removable storage devices as well as storage media for temporarily and/or more permanently containing, storing, transmitting, and retrieving computer-readable information. The system and various devices also typically will include a number of software applications, modules, services, or other elements located within at least one working memory device, including an operating system and application programs, such as a client application or Web browser. It should be appreciated that alternate embodiments may have numerous variations from that described above. For example, customized hardware might also be used and/or particular elements might be implemented in hardware, software (including portable software, such as applets), or both. Further, connection to other computing devices such as network input/output devices may be employed.

Storage media computer readable media for containing code, or portions of code, can include any appropriate media known or used in the art, including storage media and communication media, such as but not limited to volatile and non-volatile, removable and non-removable media implemented in any method or technology for storage and/or transmission of information such as computer readable instructions, data structures, program modules, or other data, including RAM, ROM, Electrically Erasable Programmable Read-Only Memory ("EEPROM"), flash memory or other memory technology, Compact Disc Read-Only Memory ("CD-ROM"), digital versatile disk (DVD), or other optical storage, magnetic cassettes, magnetic tape, magnetic disk storage, or other magnetic storage devices, or any other medium which can be used to store the desired information and which can be accessed by a system device. Based on the disclosure and teachings provided herein, a person of ordinary skill in the art will appreciate other ways and/or methods to implement the various embodiments.

The specification and drawings are, accordingly, to be regarded in an illustrative rather than a restrictive sense. It will, however, be evident that various modifications and changes may be made thereunto without departing from the broader spirit and scope of the disclosure as set forth in the claims.

Other variations are within the spirit of the present disclosure. Thus, while the disclosed techniques are susceptible to various modifications and alternative constructions, certain illustrated embodiments thereof are shown in the drawings and have been described above in detail. It should be understood, however, that there is no intention to limit the disclosure to the specific form or forms disclosed, but on the contrary, the intention is to cover all modifications, alternative constructions, and equivalents falling within the spirit and scope of the disclosure, as defined in the appended claims.

The use of the terms "a" and "an" and "the" and similar referents in the context of describing the disclosed embodiments (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. The term "connected" is to be construed as partly or wholly contained within, attached to, or joined together, even if there is something intervening. Recitation of ranges of values herein are merely intended to serve as a shorthand method of referring individually to each separate value falling within the range, unless otherwise indicated herein and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate embodiments of the disclosure and does not pose a limitation on the scope of the disclosure unless otherwise claimed. No language in the specification should be construed as indicating any non-claimed element as essential to the practice of the disclosure.

Disjunctive language such as the phrase "at least one of X, Y, or Z," unless specifically stated otherwise, is intended to be understood within the context as used in general to present that an item, term, etc., may be either X, Y, or Z, or any combination thereof (e.g., X, Y, and/or Z). Thus, such disjunctive language is not generally intended to, and should not, imply that certain embodiments require at least one of X, at least one of Y, or at least one of Z to each be present.

Various embodiments of this disclosure are described herein, including the best mode known to the inventors for carrying out the disclosure. Variations of those embodiments may become apparent to those of ordinary skill in the art upon reading the foregoing description. The inventors expect skilled artisans to employ such variations as appropriate and the inventors intend for the disclosure to be practiced otherwise than as specifically described herein. Accordingly, this disclosure includes all modifications and equivalents of the subject matter recited in the claims appended hereto as permitted by applicable law. Moreover, any combination of the above-described elements in all possible variations thereof is encompassed by the disclosure unless otherwise indicated herein or otherwise clearly contradicted by context.

What is claimed is:

1. An uninterruptable power supply system comprising:
   a backup battery;
   a power supply assembly configured to output electrical power to a data center electrical component;
   a control assembly operatively coupled with the power supply assembly, wherein the control assembly comprises a first control module and a second control module;
   wherein each of the first control module and the second control module is configured to control operation of the power supply assembly to provide electrical power to the data center electrical component based on an availability of power from a primary power source, wherein the first control module is an active control module that controls operation of the power supply assembly and the second control module is a backup control module for controlling of the power supply assembly in response to failure of the first control module; and
   a control module monitoring subsystem operatively coupled with the control assembly and configured to:
   receive first data from the first control module;
   receive second data from the second control module; and
   cause transfer of control of the power supply assembly from the active control module to the backup control module in response to determining that a difference between the first data and the second data exceeds a threshold.

2. The system of claim 1, wherein each of the first data and the second data comprises at least one of:
   an input voltage;
   an input current;
   temperature;
   power consumption data; or
   a magnetizing current.

3. The system of claim 1, wherein each of the first control module and the second control module are hot-swappable.

4. The system of claim 1, wherein the control module monitoring subsystem is further coupled to a second control assembly of a second power supply assembly and configured to monitor operation of a second active control module of the second control assembly and cause transfer of control of the second power supply assembly from the second active control module to a second backup control module in response to detecting failure of the second active control module.

5. A system, comprising:
   an uninterruptible power supply (UPS);
   a first UPS control module;
   a second UPS control module, wherein in a first control configuration the first UPS control module controls the UPS and the second UPS control module monitors the UPS, and in a second control configuration the second UPS control module controls the UPS; and
   a UPS monitoring system comprising a processor and memory, the memory having instructions stored thereon that, when executed by the processor, cause the processor to:
   receive first data from the first UPS control module;
   receive second data from the second UPS control module; and
   generate an alert signal in response to determining that a difference between the first data and the second data exceeds a threshold.

6. The system of claim 5, wherein the first UPS control module controls operation of the UPS and the second UPS control module monitors operation of the UPS in conjunction with the first UPS control module.

7. The system of claim 6, wherein the memory of the UPS monitoring system includes further instructions that, when executed by the processor, cause the processor to additionally:
   cause the second UPS control module to control operation of the UPS and the first UPS control module to monitor operation of the UPS based on the alert signal.

8. The system of claim 5, wherein the memory of the UPS monitoring system includes further instructions that, when executed by the processor, cause the processor to additionally:
   instruct replacement of the first UPS control module in response to the alert signal.

9. The system of claim 8, wherein the memory of the UPS monitoring system includes further instructions that, when executed by the processor, cause the processor to additionally:
   cause the second UPS control module to control operation of the UPS to enable hot-swapping of the first UPS control module.

10. The system of claim 5, wherein the instructions to generate the alert signal comprise further instructions that, when executed by the processor, cause the processor to convey the alert signal to a building electrical monitoring system and alert a building control operator.

11. The system of claim 5, wherein the first data and the second data each comprise data from a same monitoring point of the UPS.

12. The system of claim 5, wherein the instructions to generate the alert signal comprise further instructions that, when executed by the processor, cause the processor to:
   compare the first data and the second data to reference data; and identify the first UPS control module or the second UPS control module for replacement based on the first data or the second data differing from the reference data by at least a threshold.

13. A method of providing and monitoring an uninterruptible power supply (UPS), the method comprising:
   receiving, at a UPS monitoring system, first data from a first UPS control module, the first UPS control module capable of controlling and monitoring operation of the UPS;
   receiving, at the UPS monitoring system, second data from a second UPS control module, the second UPS control module capable of controlling and monitoring operation of the UPS in parallel with the first UPS control module; and
   generating an alert signal in response to determining that a difference between the first data and the second data exceeds a threshold.

14. The method of claim 13, wherein generating the alert signal comprises conveying the alert signal to a building power monitoring system.

15. The method of claim 13, further comprising:
   instructing replacement of the first UPS control module in response to the alert signal.

16. The method of claim 13, further comprising:
   comparing the first data and the second data to third data from a second UPS; and
   identifying the first UPS control module or the second UPS control module as faulty based on the first data or the second data differing from the third data by a second threshold.

17. The method of claim 16, further comprising:
   instructing replacement of the first UPS control module or the second UPS control module based on the identification.

18. The method of claim 13, further comprising:
   instructing the second UPS control module to control operation of the UPS in response to the alert signal.

19. The method of claim 13, further comprising:
   instructing replacement of the first UPS control module in response to the first data comprising null data.

20. The method of claim 13, wherein the first data and the second data comprise data from a same monitoring point of the UPS.

* * * * *